(12) United States Patent
Dgani et al.

(10) Patent No.: US 10,768,580 B2
(45) Date of Patent: Sep. 8, 2020

(54) TIME-TO-DIGITAL CONVERTER, DIGITAL PHASE-LOCKED LOOP, METHOD FOR OPERATING A TIME-TO-DIGITAL CONVERTER, AND METHOD FOR A DIGITAL PHASE-LOCKED LOOP

(71) Applicant: Intel IP Corporation, Santa Clara, CA (US)

(72) Inventors: Yair Dgani, Raanana (IL); Michael Kerner, Tel Mond M (IL); Elan Banin, Raanana (IL); Evgeny Shumaker, Nesher (IL); Gil Horovitz, Ekem-Hefer (IL); Ofir Degani, Nes-Ammin (IL); Rotem Banin, Even-Yehuda (IL); Aryeh Farber, Petah Tikva (IL); Rotem Avivi, Petah-Tiqwa (IL); Eshel Gordon, Aloney Aba (IL); Tami Sela, Ra'anana (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/474,562

(22) PCT Filed: Mar. 2, 2017

(86) PCT No.: PCT/IB2017/051221
§ 371 (c)(1),
(2) Date: Jun. 28, 2019

(87) PCT Pub. No.: WO2018/158614
PCT Pub. Date: Sep. 7, 2018

(65) Prior Publication Data
US 2019/0384230 A1 Dec. 19, 2019

(51) Int. Cl.
*G04F 7/08* (2006.01)
*G04F 10/00* (2006.01)
*H03L 7/085* (2006.01)

(52) U.S. Cl.
CPC ............ *G04F 10/005* (2013.01); *H03L 7/085* (2013.01)

(58) Field of Classification Search
USPC ................................. 327/147–149, 156–158
See application file for complete search history.

(56) References Cited

U.S. PATENT DOCUMENTS

| | | | | |
|---|---|---|---|---|
| 8,390,349 B1 * | 3/2013 | Ravi | ...................... | G04F 10/005 327/147 |
| 8,773,182 B1 * | 7/2014 | Degani | ................... | H03L 7/085 327/147 |

(Continued)

FOREIGN PATENT DOCUMENTS

KR 1020140112656 A 9/2014

OTHER PUBLICATIONS

P. Chen: "DTC and TDC IC Design for Ultra-Low-Power ADPLL", M. Sc. thesis, Faculty of Elect. Eng. (EEMCS), Delft Univ. of Tech., Delft, Netherlands, 2014.

(Continued)

*Primary Examiner* — Adam D Houston
(74) *Attorney, Agent, or Firm* — 2SPL Patent Attorneys PartG mbB

(57) ABSTRACT

A time-to-digital converter is provided. The time-to-digital converter includes a delay circuit configured to iteratively delay a reference signal for generating a plurality of delayed reference signals. Further, the time-to-digital converter includes a plurality of sample circuits each configured to sample an oscillation signal based on one of the plurality of delayed reference signals. The time-to-digital converter (Continued)

additionally includes a control circuit configured to deactivate at least one of the plurality of sample circuits based on a predicted value of the phase of the oscillation signal.

15 Claims, 5 Drawing Sheets

(56) References Cited

U.S. PATENT DOCUMENTS

| | | | | |
|---|---|---|---|---|
| 9,041,444 | B1* | 5/2015 | Tarighat Mehrabani | H03L 7/00 327/157 |
| 9,520,890 | B1* | 12/2016 | Ben-Bassat | H03M 1/1014 |
| 10,007,235 | B2* | 6/2018 | Wang | G04F 10/005 |
| 10,496,040 | B2* | 12/2019 | Salle | G01S 7/35 |
| 10,623,006 | B2* | 4/2020 | Nelson | H03L 7/0814 |
| 2007/0273569 | A1* | 11/2007 | Lin | G04F 10/005 341/155 |
| 2008/0315959 | A1* | 12/2008 | Zhuang | H03L 7/0814 331/17 |
| 2009/0097609 | A1* | 4/2009 | Chang | H03L 7/0991 375/376 |
| 2009/0256601 | A1 | 10/2009 | Zhang et al. | |
| 2010/0310031 | A1 | 12/2010 | Ballantyne et al. | |
| 2013/0002317 | A1* | 1/2013 | Frantzeskakis | H03L 7/08 327/156 |
| 2014/0210528 | A1 | 7/2014 | Yen et al. | |
| 2014/0218086 | A1 | 8/2014 | Burg et al. | |
| 2014/0320324 | A1* | 10/2014 | Canard | H03M 1/201 341/131 |
| 2015/0074156 | A1* | 3/2015 | Degani | H03L 7/085 708/204 |
| 2015/0116018 | A1* | 4/2015 | Chen | H03L 7/0991 327/159 |
| 2016/0109860 | A1* | 4/2016 | Cserey | H03K 19/17748 341/166 |
| 2016/0173118 | A1* | 6/2016 | Mayer | G04F 10/005 375/328 |
| 2017/0085365 | A1* | 3/2017 | Ravi | H04B 1/0475 |
| 2017/0115381 | A1* | 4/2017 | Moore | G01S 7/4865 |
| 2017/0201260 | A1* | 7/2017 | Unruh | H03L 7/0994 |
| 2018/0062660 | A1* | 3/2018 | van den Heuvel | H03L 7/087 |
| 2018/0183447 | A1* | 6/2018 | Sim | H03L 7/081 |
| 2019/0041456 | A1* | 2/2019 | Choo | G01R 31/31727 |
| 2019/0230304 | A1* | 7/2019 | Moore | G01S 17/10 |
| 2019/0384230 | A1* | 12/2019 | Dgani | G04F 10/00 |

OTHER PUBLICATIONS

"A Digital Phase-Locked Loop With Calibrated Coarse and Stochastic Fine TDC" Amer Samarah, Student Member, IEEE, and Anthony Chan Carusone, Senior Member, IEEE, IEEE Journal of Solid-State Circuits, vol. 48, No. 8, Aug. 2013.

* cited by examiner

TIME-TO-DIGITAL CONVERTER, DIGITAL PHASE-LOCKED LOOP, METHOD FOR OPERATING A TIME-TO-DIGITAL CONVERTER, AND METHOD FOR A DIGITAL PHASE-LOCKED LOOP

FIELD

Examples relate to time-to-digital conversion. In particular, examples relate to a time-to-digital converter, a digital phase-locked loop, a method for operating a time-to-digital converter, and a method for a digital phase-locked loop.

BACKGROUND

A digital phase-locked loop (DPLL) provides a low power and small area alternative to analog phase-locked loops. In a DPLL, the phase offset between the local oscillator and the reference clock is quantified by a time-to-digital convertor (TDC). The measured phase is then compared to the required phase and the result is used to correct the local oscillator frequency.

A stochastic-flash-TDC is constructed of a delay-line and multiple sets of flip-flops (FFs), with each set sampling the local oscillator based on the output of a single delay element. Mismatch and process variations provide a stochastic spread of sampling delays within the sampling ensemble. This setup avails high-resolution phase quantization at the cost of high average and peak current consumptions (due to the toggling of multiple FFs in a relatively narrow window of time). The later inadvertently affects other components in a system by, e.g., causing periodic modulation of various signals at the sampling frequency—known as "spurs".

TDC sampling may, e.g., produce spurs within a required signal bandwidth (e.g. according to a communication standard), which causes degradation of the overall system performance.

Hence, there may be a desire for an improved time-to-digital conversion technique.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
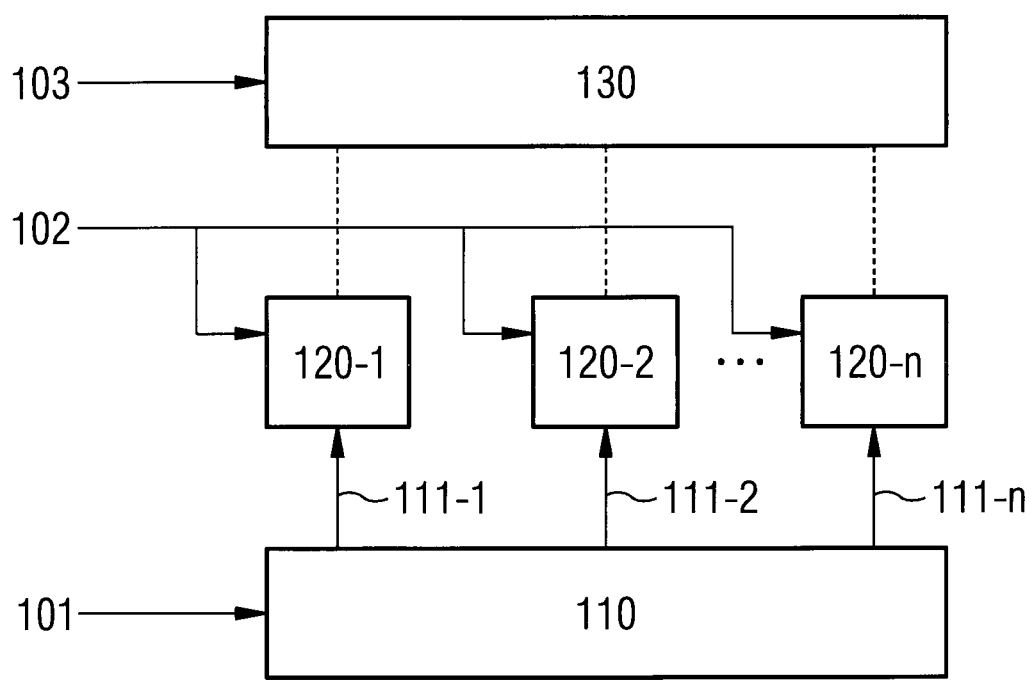
FIG. 1 illustrates an example of a TDC.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), LTE or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates a TDC 100. The TDC 100 comprises a delay circuit 110 configured to iteratively delay a reference signal 101 for generating a plurality of delayed reference signals 111-1, 111-2, . . . , 111-n. Further, the TDC 100 comprises a plurality of sample circuits 120-1, 120-2, . . . , 120-n each configured to sample an oscillation signal 102 based on one of the plurality of delayed reference signals 111-1, 111-2, . . . , 111-n. The TDC 100 additionally comprises a control circuit 130 configured to de-activate at least one of the plurality of sample circuits 120-1, 120-2, . . . , 120-n based on a received predicted value 103 of the phase of the oscillation signal.

The TDC 100 may allow to selectively activate or de-activate single ones of the plurality of sample circuits 120-1, 120-2, . . . , 120-n. Since the de-activation of the at least one of the plurality of sample circuits 120-1, 120-2, . . . , 120-n is based on the predicted value 103 of the phase of the oscillation signal, the TDC 100 may allow to activate only those sample circuits which actually sample an edge of the oscillation signal 102. This may allow to minimize the number of active sample circuits without affecting the resolution of the phase measurement. As a consequence, an average current consumption of the TDC 100 as well as a peak current consumption of the TDC 100 may be reduced. Since a periodic current consumption of the TDC 100 may be reduced, a spur level caused by the TDC 100 may be reduced significantly.

The delay circuit 110 iteratively delays the reference signal 101 in order to generate the plurality of delayed reference signals 111-1, 111-2, . . . , 111-n. For example, the delay circuit 110 may comprise a chain of delay elements (not illustrated) which iteratively delay the (received) reference signal 101. Accordingly, each of the delay elements may output a delayed reference signal. All delay elements may delay the reference signal 101 or a delayed reference signal by a same delay time, respectively.

The plurality of sample circuits 120-1, 120-2, . . . , 120-n sample the (received) oscillation signal 102 at different sample times. The sample time of one of the plurality of sample circuits 120-1, 120-2, . . . , 120-n is (substantially) determined by the delayed reference signal supplied to the one of the plurality of sample circuits 120-1, 120-2, . . . , 120-n by the delay circuit 110. The plurality of sample circuits 120-1, 120-2, . . . , 120-n may indicate a phase difference of the oscillation signal 102 to the reference signal 101. For example, output signals of the plurality of sample circuits 120-1, 120-2, . . . , 120-n may indicate if the oscillation signal 102 is leading or trailing the delayed reference signals 111-1, 111-2, . . . , 111-n, respectively. The output signals of the plurality of sample circuits 120-1, 120-2, . . . , 120-n may, e.g., be supplied to a further evaluation circuit (not illustrated) such as decoder.

The control circuit 130 may de-activate one or more of the plurality of sample circuits 120-1, 120-2, . . . , 120-n based on the predicted value 103 of the phase of the oscillation signal. For example, the control circuit 130 may cause one or more of the plurality of sample circuits 120-1, 120-2, . . . , 120-n to switch from a fully operational mode to a partly operational mode or a non-operational mode. In some examples, the control circuit 130 may cause one or more of the plurality of sample circuits 120-1, 120-2, . . . , 120-n to partly or fully reduce its respective sampling abilities. In other words, a de-activated sample circuit may be fully de-activated, or be partly de-activated.

The predicted value 103 of the phase of the oscillation signal indicates a future value of the phase of the oscillation signal 102. For example, the predicted value 103 of the phase of the oscillation signal may indicate a predicted phase of the oscillation signal 102 in a second oscillation cycle of the oscillation signal that succeeds a first oscillation cycle of the oscillation signal 102 for which the phase difference to the reference signal 101 is determined by the TDC 100. The second oscillation cycle may, e.g., immediately succeed the first oscillation cycle. However, the second oscillation cycle may be any other future oscillation cycle of the oscillation signal that succeeds the first oscillation cycle. The predicted value 103 of the phase of the oscillation signal may allow to activate only those sample circuits of the TDC 100 which will sample an edge of the oscillation signal 102 during the future oscillation cycle.

The predicted value 103 of the phase of the oscillation signal may, e.g., be based on an output value of the TDC 100. The output value of the TDC 100 indicates a phase difference between the reference signal 101 and the oscillation signal 102. Based on the output value of the TDC 100, a current phase of the oscillation signal 102 may be determined (e.g. by a DPLL comprising the TDC 100), which may serve as a base for calculating the predicted value 103 of the phase of the oscillation signal.

In some examples, at least one of the plurality of sample circuits 120-1, 120-2, . . . , 120-n may comprise a plurality of flip-flop circuits (not illustrated). The plurality of flip-flop circuits may be configured to receive the oscillation signal 102 and the delayed reference signal supplied to the one of the plurality of sample circuits 120-1, 120-2, . . . , 120-n. Each of the plurality of flip-flop circuits may indicate if the oscillation signal 102 is leading or trailing the delayed reference signals supplied to the one of the plurality of sample circuits 120-1, 120-2, . . . , 120-n. Variations of the manufacturing process for the plurality of flip-flop circuits and other reasons may provide a stochastic spread of the sampling delays within the plurality of flip-flop circuits. Hence, a phase resolution of the TDC 100 may be better (e.g. lower) than the delay time of the delay circuit's delay elements. That is, the TDC 100 may, in some examples, be a stochastic-flash-TDC.

Part of the plurality of flip-flop circuits in a sample circuit may, in some examples, be permanently activated. The control circuit 130 may, then, be further configured to de-activate the other ones of the plurality of flip-flop circuits in the sample circuit based on the predicted value 103 of the phase of the oscillation signal. That is, the sample circuit may be partly deactivated by the control circuit 130. This may allow coarse sampling of the oscillation signal 102 by the sample circuit. For example, if the predicted value 103 of the phase of the oscillation signal indicates a wrong future phase of the oscillation signal 102, keeping part of the plurality of flip-flop circuits constantly activated for at least one of the plurality of sample circuits 120-1, 120-2, . . . , 120-n may allow to at least coarsely determine a phase difference between the oscillation signal 102 and the reference signal 101. This may allow to identify a wrong phase prediction for the oscillation signal 102, and to correct the phase prediction for the oscillation signal 102.

In some examples, the TDC 100 may comprise at least one switch circuit (not illustrated) coupled between an input node of one of the plurality of sample circuits 120-1, 120-2, . . . , 120-n and a node of the TDC 100 that is configured to supply the oscillation signal 102 to the one of the plurality of sample circuits 120-1, 120-2, . . . , 120-n. The switch circuit is configured to control a propagation of the oscillation signal 102 to the one of the plurality of sample circuits 120-1, 120-2, . . . , 120-n. The control circuit 130 may be configured to control the switch circuit to block the propagation of the oscillation signal 102 to the one of the plurality of sample circuits 120-1, 120-2, . . . , 120-n based on the predicted value 103 of the phase of the oscillation signal. By opening the switch, the propagation of the oscillation signal 102 to the one of the plurality of sample circuits 120-1, 120-2, . . . , 120-n may be blocked. That is, the switch circuit may be used for de-activating the one of the plurality of sample circuits 120-1, 120-2, . . . , 120-n.

For example, the switch circuit may control the supply of the oscillation signal 102 to the plurality of flip-flop circuits in a sample circuit. Blocking the propagation of the oscillation signal 102 to one or more of the plurality of flip-flop circuits via the switch circuit may allow to de-activate the one or more of the plurality of flip-flop circuits.

In some example, each of the plurality of sample circuits 120-1, 120-2, . . . , 120-n may comprise a plurality of flip-flop circuits. A first portion of the plurality of flip-flop circuits may be permanently activated for each of the plurality of sample circuits 120-1, 120-2, . . . , 120-n. The control circuit 130 may be configured to de-activate a second portion (e.g. the other ones) of the plurality of flip-flop circuits for at least one of the plurality of sample circuits 120-1, 120-2, . . . , 120-n based on the predicted value 103 of the phase of the oscillation signal.

The proposed concept may, hence, allow to minimize the number of toggled flip-flops without affecting the phase measurement resolution. This may reduce the periodic current consumption and consequently lower the spur level significantly. Additionally, the average power consumption of the TDC may be reduced.

In order to enable a robust system operation, some of the flip-flops may be constantly enabled (e.g. a single flip-flop per delay element). This may allow coarse estimation of the phase of the oscillation signal and prevent the prediction mechanism from divergence.

Generally speaking, some examples relate to a means for time-to-digital conversion. The means for time-to-digital conversion comprises a means for iteratively delaying a reference signal to generate a plurality of delayed reference signals. Further, the means for time-to-digital conversion comprises a plurality of means for sampling an oscillation signal based on one of the plurality of delayed reference signals, respectively. The means for time-to-digital conversion additionally comprises a means for de-activating at least one of the plurality of sample circuits based on a received predicted value of the phase of the oscillation signal.

In some examples, the predicted value of the phase of the oscillation signal is based on an output value of the means for time-to-digital conversion. The output value of the means for time-to-digital conversion indicates a phase difference between the reference signal and the oscillation signal.

The means for time-to-digital conversion may be implemented by a TDC described above or below (e.g. FIG. 1). The means for iteratively delaying a received reference signal may be implemented by a delay circuit described above or below (e.g. FIG. 1). The plurality of means for sampling a received oscillation signal may be implemented by a plurality of sample circuits described above or below (e.g. FIG. 1). The means for de-activating at least one of the plurality of sample circuits may be implemented by a control circuit described above or below (e.g. FIG. 1).

Figure 2:
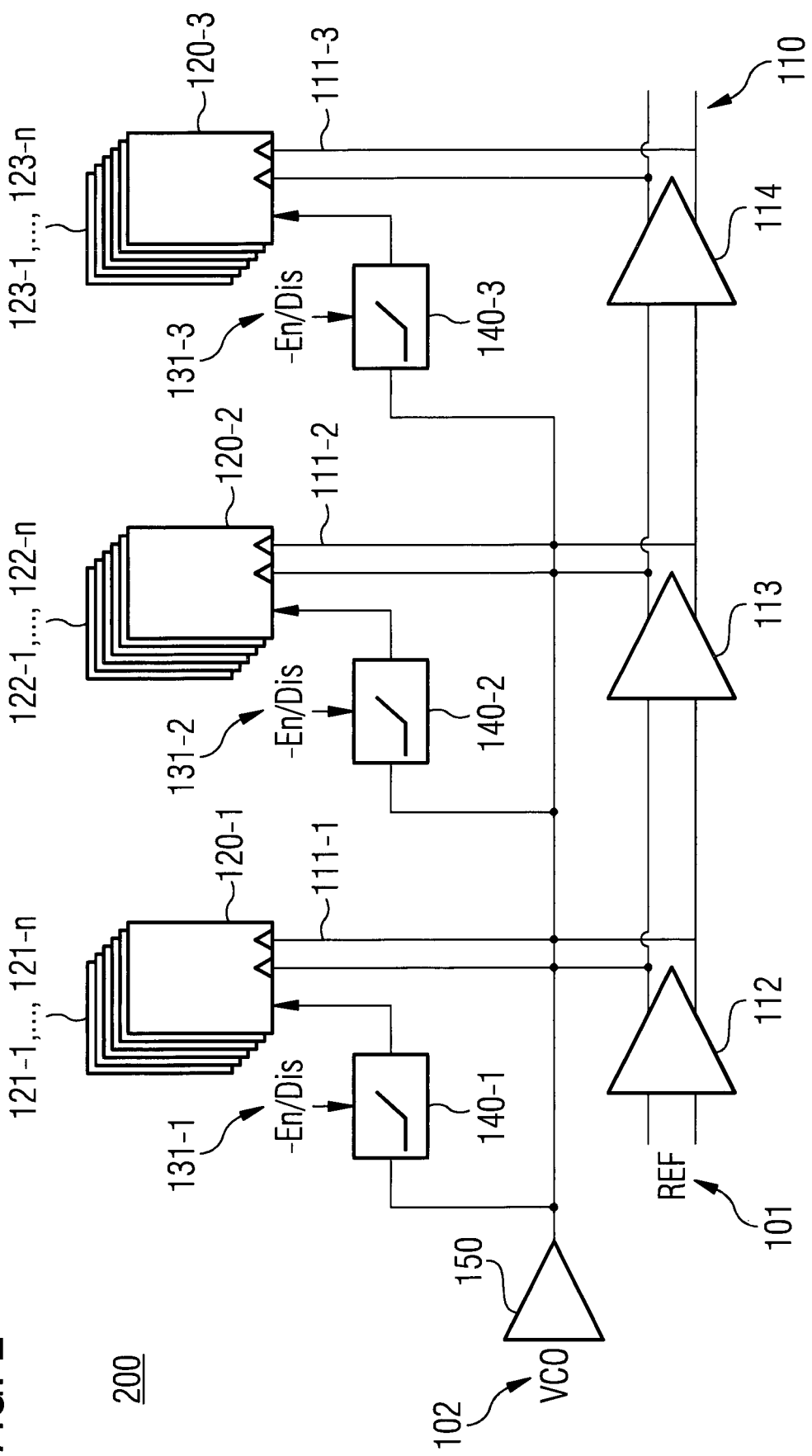
FIG. 2 illustrates another example of a TDC.

In FIG. 2, another TDC 200 is illustrated. The TDC 200 comprises a delay circuit 110. The delay circuit 110 comprises three delay elements 112, 113 and 114. The delay elements 112, 113, 114 iteratively delay a received reference signal 101 in order to generate delayed reference signals 111-1, 111-2, 111-3. As indicated in FIG. 2, the reference signal 101 as well as the delayed reference signals 111-1, 111-2, 111-3 may be differential signals.

Further, the TDC 200 comprises three sample circuits 120-1, 120-2, 120-3. Each of the sample circuits 120-1, 120-2, 120-3 is configured to sample a received oscillation signal 102 based on one of the delayed reference signals 111-1, 111-2, 111-3. Each of sample circuits 120-1, 120-2, 120-3 comprises a plurality of flip-flop circuits. Sample circuit 120-1 comprises flip-flop circuits 121-1, . . . , 121-n, sample circuit 120-2 comprises flip-flop circuits 122-1, . . . , 122-n and sample circuit 120-3 comprises flip-flop circuits 123-1, . . . , 123-n. The plurality of flip-flop circuits receive the oscillation signal 102 and the delayed reference signal 111-1, 111-2 or 111-3 supplied to the respective sample circuits 120-1, 120-2, 120-3. That is, TDC 200 is a stochastic-flash-TDC.

The sample circuits 120-1, 120-2, 120-3 may be de-activated individually. Therefore, the TDC 200 comprises switch circuits 140-1, 140-2 and 140-3. The switch circuits 140-2, 140-2 and 140-3 are coupled between node 150 (e.g. a buffer) that supplies the oscillation signal 102 to the sample circuits 120-1, 120-2, 120-3, and a respective input node of the sample circuits 120-1, 120-2, 120-3. The switch circuits 140-1, 140-2, 140-3 are configured to control a propagation of the oscillation signal 102 to the sample circuits 120-1, 120-2, 120-3. The switch circuits 140-1, 140-2, 140-3 are controlled via control signals 131-1, 131-2, 131-3 by a control circuit (not illustrated) of the TDC 200 based on a predicted value of the phase of the oscillation signal 102.

The switch circuits 140-1, 140-2, 140-3 allow to block the propagation of the oscillation signal 102 to single ones of the sample circuits 120-1, 120-2, 120-3. That is, the switch circuits 140-1, 140-2, 140-3 may be used for de-activating single ones of the sample circuits 120-1, 120-2, 120-3. For example, if the predicted value of the phase of the oscillation signal 102 indicates that the future phase of the oscillation signal 102 is such that sample circuits 120-3 will not sample an signal edge of the oscillation signal 102, switch circuit 140-3 may be controlled to block the propagation of the oscillation signal 102 to sample circuit 120-3, i.e., to deactivate sample circuit 120-3.

As indicated above, part of the flip-flop circuits may be permanently activated for each of the sample circuits 120-1, 120-2, 120-3. For example, flip-flop circuit 121-1 may be permanently activated in sample circuit 120-1, flip-flop circuit 122-1 may be permanently activated in sample circuit 120-2 and flip-flop circuit 123-1 may be permanently activated in sample circuit 120-3. The remaining (other) ones of the plurality of flip-flop circuits in each sample circuits 120-1, 120-2, 120-3 may be de-activated or activated based on the predicted value of the phase of the oscillation signal 102. For example, the switch circuits 140-1, 140-2, 140-3 may be controlled to block the propagation of the oscillation signal 102 to the other flip-flop circuits of sample circuits 120-1, 120-2, 120-3, respectively.

TDC 200 may, hence, be understood as a partially gated TDC. In order to have the ability to enable part of the flip-flop circuits, a gate is added for each set of flip-flop circuits which may enable or disable the specific set.

In some examples, TDC 200 may further allow prediction error recovery. A robust system operation may be enabled by keeping some of the flip-flop circuits constantly enabled, (e.g. a single flip-flop circuit per delay element). This may ensure coarse estimation of the oscillations signal 102's phase and prevent the prediction mechanism from divergence.

Figure 3:
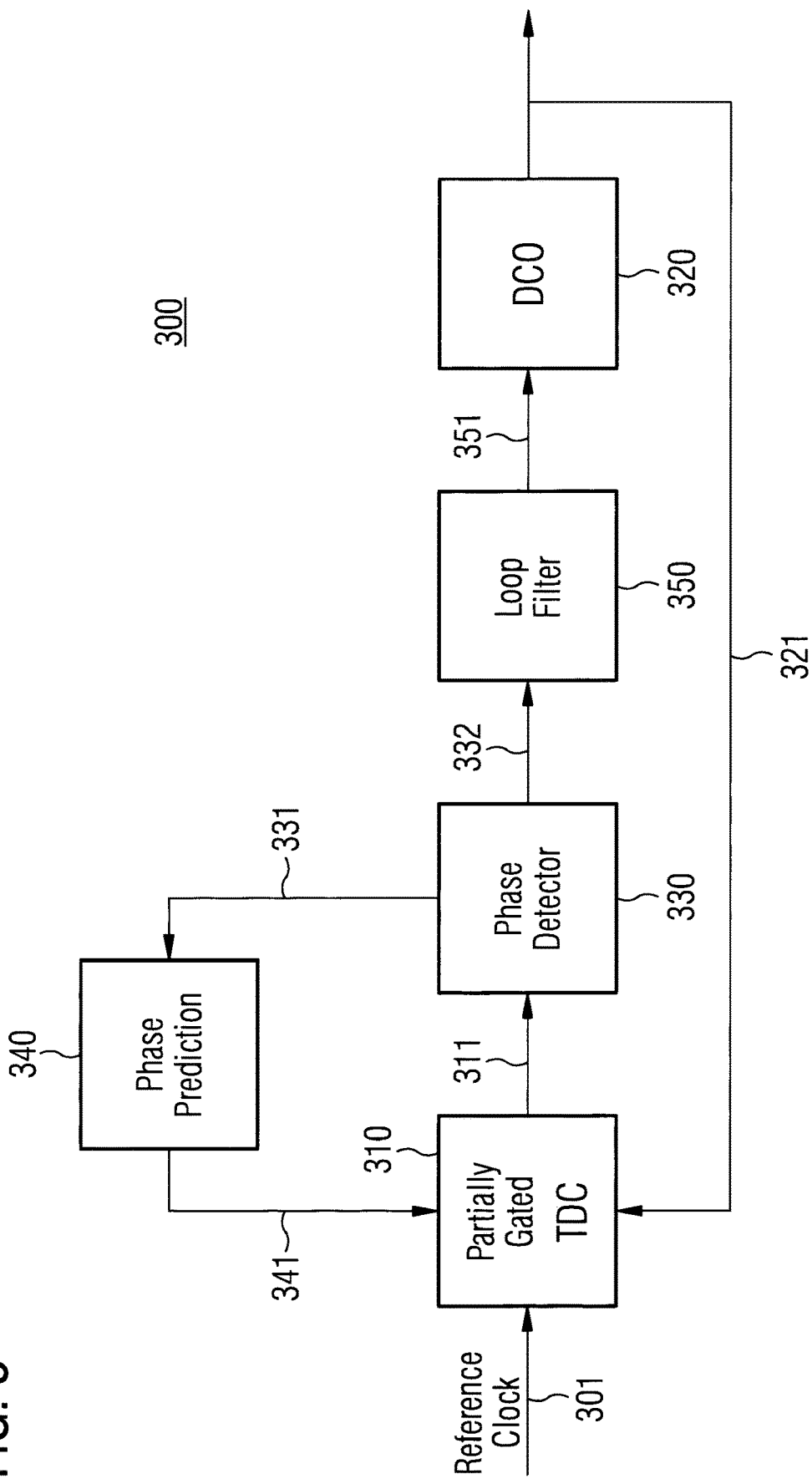
FIG. 3 illustrates an example of a DPLL.

An example of an implementation using a TDC according to one or more aspects of the proposed concept or one or more examples described above is illustrated in FIG. 3. FIG. 3 illustrates a DPLL 300.

The DPLL 300 comprises a TDC 310 according to one or more aspects of the proposed concept or one or more examples described above. The TDC 310 is further configured to generate an output value 311 indicative of a phase difference between the reference signal 301 and the oscillation signal 321. The oscillation signal 321 is generated by a controlled oscillator 320 within the DPLL 300. Further, the DPLL 300 comprises a decoder circuit 330 configured to calculate, based on the output value 311 of the TDC 310, a current value 331 of the phase of the oscillation signal 321. Additionally, the DPLL 300 comprises a processing circuit 340 configured to calculate, based on the current value 331 of the phase of the oscillation signal 321, the predicted value 341 of the phase of the oscillation signal 321.

The predicted value 341 of the phase of the oscillation signal 321 may allow the TDC 310 to selectively activate or de-activate single ones of its plurality of sample circuits. For example, the TDC 310 may activate only those sample circuits which actually sample an edge of the oscillation signal 321. This may allow to minimize the number of active sample circuits without affecting the resolution of the phase measurement. As a consequence, an average current consumption of the TDC 310 as well as a peak current consumption of the TDC 310 may be reduced. Since a periodic current consumption of the TDC 310 may be reduced, a spur level caused by the TDC 310 may be reduced significantly. The DPLL 300 may, hence, allow low phase-noise synthesis of the oscillation signal 321.

The decoder circuit 330 may further calculate the phase error 332 of oscillation signal 321 by comparing the current phase of the oscillation signal 321 to the required (desired) phase of the oscillation signal 321.

As indicated in FIG. 3, the DPLL 300 may further comprise a loop filter 350 for supplying, based on the phase error 332 of the oscillation signal 321, a control word 351 to the controlled oscillator 320.

The processing circuit 340 may, e.g., be configured to further calculate the predicted value 341 of the phase of the oscillation signal 321 based on a frequency of the oscillation signal. For example, the processing circuit 340 may calculate the predicted value 341 of the phase of the oscillation signal 321 based on an expression which is mathematically correspondent to $$\varphi_{n+1}^{prediction} = \varphi_n^{measure} + f \quad (1),$$

with $\varphi_{n+1}^{prediction}$ denoting the predicted value of the phase of the oscillation signal 321, $\varphi_n^{measured}$ denoting the current (measured) value of the phase of the oscillation signal 321 and f denoting the current frequency of the oscillation signal 321. The frequency of a signal may be understood as the derivative of the phase, i.e., $$f = \frac{d\varphi}{dt}$$

with φ being the signal's phase. The derivative represents the accumulation rate of the signal's phase in time. Since the control frequency f of the DPLL is known and the current phase $\varphi_n^{measured}$ is known, an approximation of the phase of a future (e.g. the immediately following) cycle may be predicted according to equation (1). That is, the prediction may be based on the knowledge of the oscillation signal 321's frequency and the current phase.

Instead of the current value of the phase of the oscillation signal 321, a mean value of a plurality of historic measured values of the phase of the oscillation signal 321 may alternatively be used for calculating the predicted value of the phase of the oscillation signal 321. Also the desired (required) frequency of the oscillation signal 321 may be used instead of the current frequency of the oscillation signal 321 for calculating the predicted value of the phase of the oscillation signal 321. However, calculating the predicted value of the phase of the oscillation signal 321 is not limited to the given examples.

For example, in each sampling clock, the oscillation signal 321's current phase may be observed and the next phase may be predicted. Then the corresponding TDC flip-flop circuits (surrounding the expected phase) may be enabled.

For each reference clock sampling event, the edge of the oscillation signal 321 is actually sampled by a small portion of the flip-flop circuits. Therefore, for each event, only this small group may be enabled. In order to know which group should be enabled, e.g., a prediction algorithm which estimates the next oscillation signal phase may be employed. The prediction may be based on the previous (measured) phase and the desired frequency. This may allow significant reduction of both average and peak current consumptions.

The proposed concept may further allow considerable quantization noise averaging, and since it is all-digital it may add no noise to the reference clock.

Figure 4:
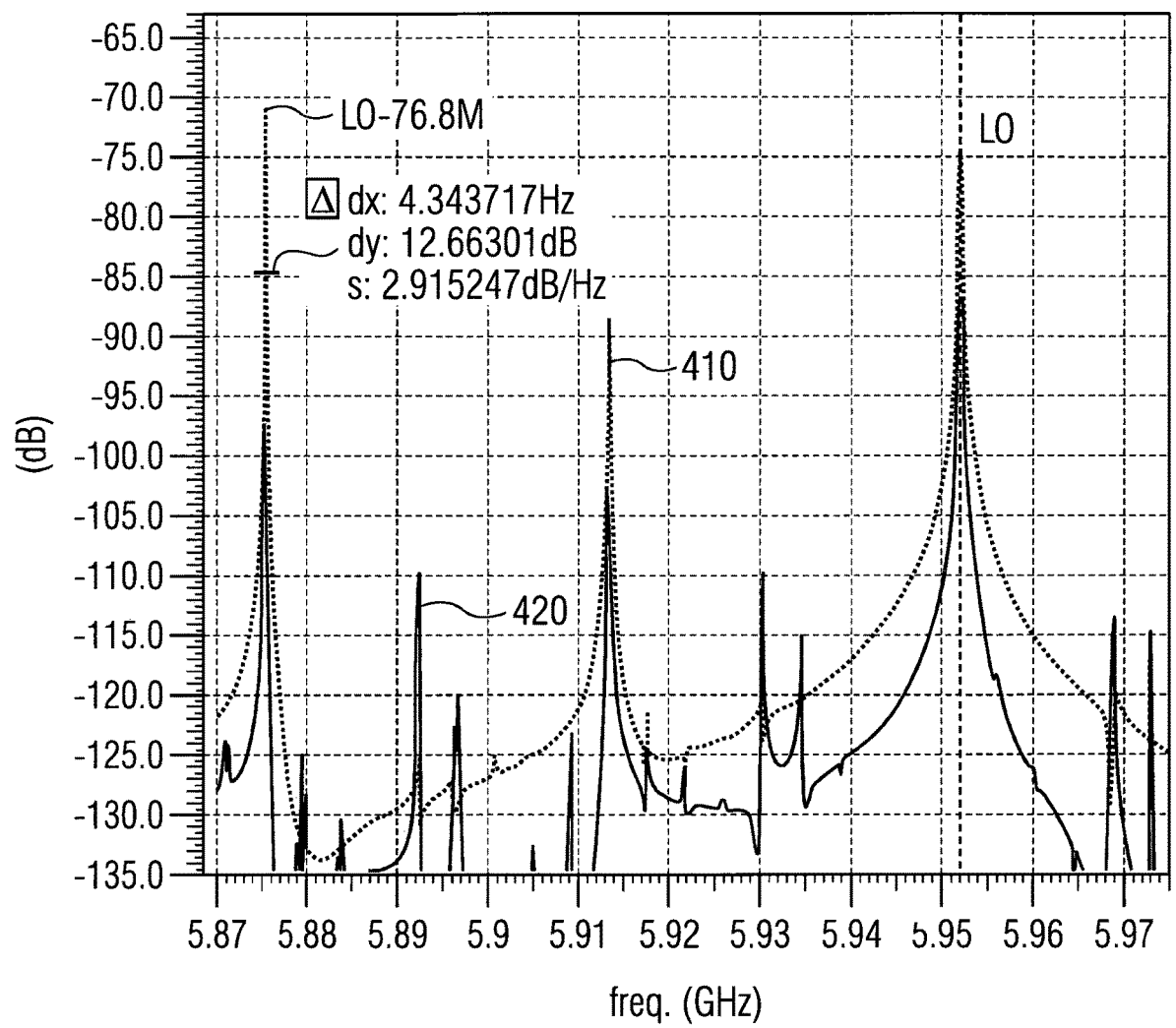
FIG. 4 illustrates an example of DPLL's frequency spectrum.

The effect of using a TDC according to one or more aspects of the proposed concept or one or more examples described above in a DPLL is illustrated in FIG. 4. FIG. 4 illustrates the spurs on integer reference clock multiples (e.g. n*76.8 MHz).

Line 410 illustrates the measured reference clock spurs, if the DPLL comprises a conventional TDC that uses 8 flip-flop circuits in every cycle. Line 420 illustrates the measured reference clock spurs, if the DPLL comprises a TDC according to one or more aspects of the proposed concept or one or more examples described above. It is evident from FIG. 4 that an improvement of the spur magnitude is obtained (e.g. by ca. 12.5 dB in the example of FIG. 4).

Figure 5:
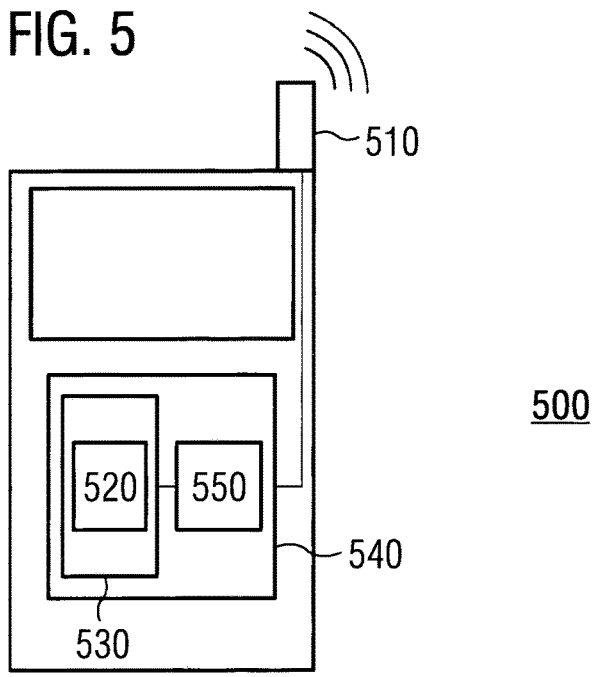
FIG. 5 illustrates an example of a mobile device comprising a TDC.

An example of an implementation using a TDC according to one or more aspects of the proposed concept or one or more examples described above is illustrated in FIG. 5. FIG. 5 schematically illustrates an example of a mobile device 500 (e.g. mobile phone, smartphone, tablet-computer, or laptop) comprising a TDC 520 according to an example described herein. To this end, mobile devices may be provided with attenuated spurs in the receive path, which may prevent degradation of receive sensitivity. The TDC 520 may enable low phase-noise oscillation signal synthesis as well as reduced power consumption.

In some examples, a DPLL 530 according to an example described herein may comprise the TDC 520. The DPLL 530 may allow low phase-noise synthesis of an oscillation signal.

A transceiver 540 may comprise the TDC 520 and/or the DPLL 530 in some examples. The transceiver 540 may, e.g., further comprise a mixing circuit 550 configured to receive a signal that is based on the oscillation signal generated by the DPLL 530.

An antenna element 510 of the mobile device 500 may be coupled to the transceiver 540.

Figure 6:
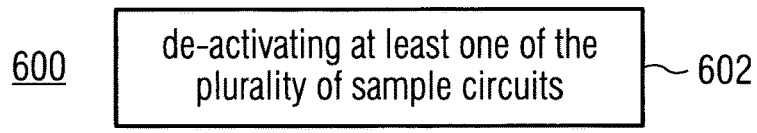
FIG. 6 illustrates a flowchart of an example of a method for operating a TDC.

An example of a method 600 for operating a TDC is illustrated by means of a flowchart in FIG. 6. The TDC comprises a delay circuit configured to iteratively delay a reference signal for generating a plurality of delayed reference signals, and a plurality of sample circuits each configured to sample an oscillation signal based on one of the plurality of delayed reference signals. The method 600 comprises de-activating 602 at least one of the plurality of sample circuits based on a received predicted value of the phase of the oscillation signal.

More details and aspects of the method are mentioned in connection with the proposed concept or one or more examples described above (e.g. FIGS. 1 to 4). The method may comprise one or more additional optional features corresponding to one or more aspects of the proposed concept or one or more examples described above.

Figure 7:
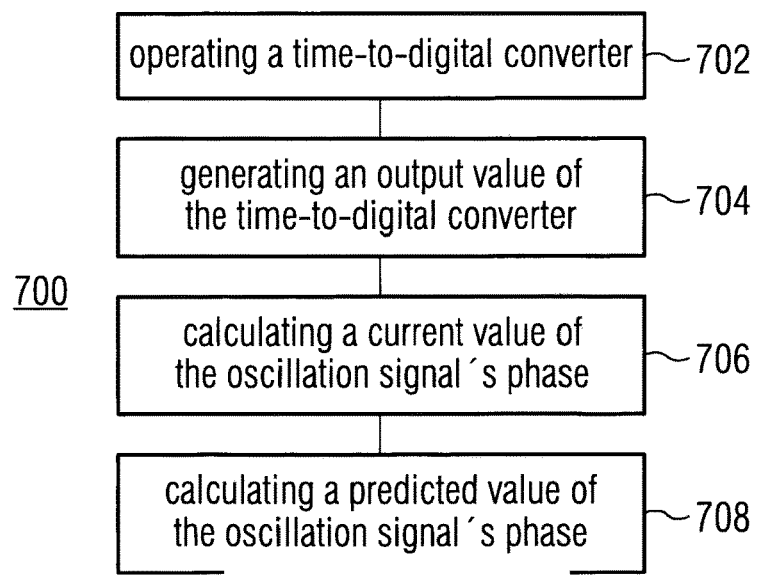
FIG. 7 illustrates a flowchart of an example of a method for a DPLL.

An example of a method 700 for a DPLL is illustrated by means of a flowchart in FIG. 7. The method 700 comprises operating 702 a TDC according to according to one or more aspects of the proposed concept or one or more examples described above (e.g. according to method 600). Further, the method 700 comprises generating 704 an output value of the TDC that is indicative of a phase difference between the reference signal and the oscillation signal. The oscillation signal is generated by a controlled oscillator within the DPLL. The method 700 also comprises calculating 706, based on the output value of the TDC, a current value of the phase of the oscillation signal. Additionally, the method 700 comprises calculating 708, based on the current value of the phase of the oscillation signal, a predicted value of the phase of the oscillation signal.

More details and aspects of the method are mentioned in connection with the proposed concept or one or more examples described above (e.g. FIGS. 3 and 4). The method may comprise one or more additional optional features corresponding to one or more aspects of the proposed concept or one or more examples described above.

The examples as described herein may be summarized as follows:

Example 1 is a time-to-digital converter, comprising: a delay circuit configured to iteratively delay a reference signal for generating a plurality of delayed reference signals; a plurality of sample circuits each configured to sample an oscillation signal based on one of the plurality of delayed reference signals; and a control circuit configured to de-activate at least one of the plurality of sample circuits based on a predicted value of the phase of the oscillation signal.

In example 2, the predicted value of the phase of the oscillation signal in the time-to-digital converter of example 1 is based on an output value of the time-to-digital converter, wherein the output value of the time-to-digital converter indicates a phase difference between the reference signal and the oscillation signal.

In example 3, the predicted value of the phase of the oscillation signal in the time-to-digital converter of example 2 indicates a predicted phase of the oscillation signal in a second oscillation cycle of the oscillation signal that succeeds a first oscillation cycle of the oscillation signal for which the phase difference to the reference signal is determined by the time-to-digital converter.

In example 4, at least one of the plurality of sample circuits in the time-to-digital converter of any of examples 1 to 3 comprises a plurality of flip-flop circuits.

In example 5, a first portion of the plurality of flip-flop circuits in the time-to-digital converter of example 4 is permanently activated, wherein the control circuit is further configured to deactivate a second portion of the plurality of flip-flop circuits based on the predicted value of the phase of the oscillation signal.

In example 6, the time-to-digital converter of any of the preceding examples further comprises at least one switch circuit coupled between an input node of one of the plurality of sample circuits and a node of the time-to-digital converter that is configured to supply the oscillation signal to the one of the plurality of sample circuits, wherein the control circuit is further configured to control the switch circuit to block a propagation of the oscillation signal to the one of the plurality of sample circuits based on the predicted value of the phase of the oscillation signal.

Example 7 is a digital phase-locked loop, comprising: a time-to-digital converter according to any of examples 1 to 6, wherein the time-to-digital converter is further configured to generate an output value indicative of a phase difference between the reference signal and the oscillation signal, and wherein the oscillation signal is generated by a controlled oscillator within the digital phase-locked loop; a decoder circuit configured to calculate, based on the output value of the time-to-digital converter, a current value of the phase of the oscillation signal; and a processing circuit configured to calculate, based on the current value of the phase of the oscillation signal, the predicted value of the phase of the oscillation signal.

In example 8, the processing circuit in the digital phase-locked loop of example 7 is further configured to calculate the predicted value of the phase of the oscillation signal based on a frequency of the oscillation signal.

Example 9 is a transceiver comprising a time-to-digital converter according to any of examples 1 to 6, or a digital phase-locked loop according to example 7 or example 8.

In example 10, the transceiver of example 9 further comprises a mixing circuit configured to receive a signal that is based on the oscillation signal.

Example 11 is a mobile device comprising a time-to-digital converter according to any of examples 1 to 6, a digital phase-locked loop according to example 7 or example 8, or a transceiver according to example 9 or example 10.

In example 12, the mobile device of example 11 further comprises at least one antenna element coupled to the transceiver.

Example 13 is a means for time-to-digital conversion, comprising: a means for iteratively delaying a reference signal to generate a plurality of delayed reference signals; a plurality of means for sampling an oscillation signal based on one of the plurality of delayed reference signals, respectively; and a means for de-activating at least one of the plurality of sample circuits based on a predicted value of the phase of the oscillation signal.

In example 14, the predicted value of the phase of the oscillation signal in the means of example 13 is based on an output value of the means for time-to-digital conversion, and wherein the output value of the means for time-to-digital conversion indicates a phase difference between the reference signal and the oscillation signal.

Example 15 is a method for operating a time-to-digital converter that comprises a delay circuit configured to iteratively delay a reference signal for generating a plurality of delayed reference signals, and a plurality of sample circuits each configured to sample an oscillation signal based on one of the plurality of delayed reference signals, wherein the method comprises: de-activating at least one of the plurality of sample circuits based on a predicted value of the phase of the oscillation signal.

In example 16, the predicted value of the phase of the oscillation signal in the method of example 15 is based on an output value of the time-to-digital converter, and wherein the output value of the time-to-digital converter indicates a phase difference between the reference signal and the oscillation signal.

In example 17, the predicted value of the phase of the oscillation signal in the method of example 16 indicates a predicted phase of the oscillation signal in a second oscillation cycle of the oscillation signal that succeeds a first oscillation cycle of the oscillation signal for which the phase difference to the reference signal is determined by the time-to-digital converter.

In example 18, at least the one of the plurality of sample circuits in the method of any of examples 15 to 17 comprises a plurality of flip-flop circuits, wherein a first portion of the plurality of flip-flop circuits is permanently activated, and wherein de-activating at least one of the plurality of sample circuits comprises: de-activating a second portion of the plurality of flip-flop circuits based on the predicted value of the phase of the oscillation signal.

In example 19, the time-to-digital converter in the method of any of the preceding examples further comprises at least one switch circuit coupled between an input node of the one of the plurality of sample circuits and a node of the time-to-digital converter that is configured to supply the oscillation signal to the one of the plurality of sample circuits, and wherein de-activating at least one of the plurality of sample circuits comprises: controlling the switch circuit to block a propagation of the oscillation signal to the one of the plurality of sample circuits based on the predicted value of the phase of the oscillation signal.

Example 20 is a method for a digital phase-locked loop, comprising: operating a time-to-digital converter according to the method of any of examples 15 to 19; generating an output value of the time-to-digital converter that is indicative of a phase difference between the reference signal and the oscillation signal, wherein the oscillation signal is generated by a controlled oscillator within the digital phase-locked loop; calculating, based on the output value, a current value of the phase of the oscillation signal; and calculating, based on the current value of the phase of the oscillation signal, a predicted value of the phase of the oscillation signal.

In example 21, calculating the predicted value of the phase of the oscillation signal in the method of example 20 is further based on a frequency of the oscillation signal.

Example 22 is a computer readable storage medium having stored thereon a program having a program code for performing the method of any of examples 15 to 19, or the method of example 20 or 21, when the program is executed on a computer or processor.

Example 23 is a computer program having a program code configured to perform the method of any of examples 15 to 19, or the method of example 20 or 21, when the computer program is executed on a computer or processor.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A time-to-digital converter, comprising:
a delay circuit configured to iteratively delay a reference signal for generating a plurality of delayed reference signals;
a plurality of sample circuits each configured to sample an oscillation signal based on one of the plurality of delayed reference signals; and
a control circuit configured to de-activate at least one of the plurality of sample circuits based on a predicted value of the phase of the oscillation signal.

2. The time-to-digital converter of claim 1, wherein the predicted value of the phase of the oscillation signal is based on an output value of the time-to-digital converter, and wherein the output value of the time-to-digital converter indicates a phase difference between the reference signal and the oscillation signal.

3. The time-to-digital converter of claim 2, wherein the predicted value of the phase of the oscillation signal indicates a predicted phase of the oscillation signal in a second oscillation cycle of the oscillation signal that succeeds a first oscillation cycle of the oscillation signal for which the phase difference to the reference signal is determined by the time-to-digital converter.

4. The time-to-digital converter of claim 1, wherein at least one of the plurality of sample circuits comprises a plurality of flip-flop circuits.

5. The time-to-digital converter of claim 4, wherein a first portion of the plurality of flip-flop circuits is permanently activated, and wherein the control circuit is further configured to de-activate a second portion of the plurality of flip-flop circuits based on the predicted value of the phase of the oscillation signal.

6. The time-to-digital converter of claim 1, wherein the time-to-digital converter further comprises at least one switch circuit coupled between an input node of one of the plurality of sample circuits and a node of the time-to-digital converter that is configured to supply the oscillation signal to the one of the plurality of sample circuits, and wherein the control circuit is further configured to control the switch circuit to block a propagation of the oscillation signal to the one of the plurality of sample circuits based on the predicted value of the phase of the oscillation signal.

7. A digital phase-locked loop, comprising:
a time-to-digital converter according to claim 1, wherein the time-to-digital converter is further configured to generate an output value indicative of a phase difference between the reference signal and the oscillation signal, and wherein the oscillation signal is generated by a controlled oscillator within the digital phase-locked loop;
a decoder circuit configured to calculate, based on the output value of the time-to-digital converter, a current value of the phase of the oscillation signal; and
a processing circuit configured to calculate, based on the current value of the phase of the oscillation signal, the predicted value of the phase of the oscillation signal.

8. The digital phase-locked loop of claim 7, wherein the processing circuit is further configured to calculate the predicted value of the phase of the oscillation signal based on a frequency of the oscillation signal.

9. A method for operating a time-to-digital converter that comprises a delay circuit configured to iteratively delay a reference signal for generating a plurality of delayed reference signals, and a plurality of sample circuits each configured to sample an oscillation signal based on one of the plurality of delayed reference signals, wherein the method comprises:

de-activating at least one of the plurality of sample circuits based on a predicted value of the phase of the oscillation signal.

10. The method of claim 9, wherein the predicted value of the phase of the oscillation signal is based on an output value of the time-to-digital converter, and wherein the output value of the time-to-digital converter indicates a phase difference between the reference signal and the oscillation signal.

11. The method of claim 10, wherein the predicted value of the phase of the oscillation signal indicates a predicted phase of the oscillation signal in a second oscillation cycle of the oscillation signal that succeeds a first oscillation cycle of the oscillation signal for which the phase difference to the reference signal is determined by the time-to-digital converter.

12. The method of claim 9, wherein at least the one of the plurality of sample circuits comprises a plurality of flip-flop circuits, wherein a first portion of the plurality of flip-flop circuits is permanently activated, and wherein de-activating at least one of the plurality of sample circuits comprises:

de-activating a second portion of the plurality of flip-flop circuits based on the predicted value of the phase of the oscillation signal.

13. The method of claim 9, wherein the time-to-digital converter further comprises at least one switch circuit coupled between an input node of the one of the plurality of sample circuits and a node of the time-to-digital converter that is configured to supply the oscillation signal to the one of the plurality of sample circuits, and wherein de-activating at least one of the plurality of sample circuits comprises:

controlling the switch circuit to block a propagation of the oscillation signal to the one of the plurality of sample circuits based on the predicted value of the phase of the oscillation signal.

14. A method for a digital phase-locked loop, comprising:

operating a time-to-digital converter according to the method of claim 9;

generating an output value of the time-to-digital converter that is indicative of a phase difference between the reference signal and the oscillation signal, wherein the oscillation signal is generated by a controlled oscillator within the digital phase-locked loop;

calculating, based on the output value, a current value of the phase of the oscillation signal; and calculating, based on the current value of the phase of the oscillation signal, a predicted value of the phase of the oscillation signal.

15. The method of claim 14, wherein calculating the predicted value of the phase of the oscillation signal is further based on a frequency of the oscillation signal.

* * * * *